United States Patent
Gu et al.

(10) Patent No.: US 11,721,728 B2
(45) Date of Patent: Aug. 8, 2023

(54) SELF-ALIGNED CONTACT

(71) Applicant: GLOBALFOUNDRIES U.S. INC., Santa Clara, CA (US)

(72) Inventors: Sipeng Gu, Clifton Park, NY (US); Jiehui Shu, Dalian (CN); Haiting Wang, Clifton Park, NY (US); Yanping Shen, Saratoga Springs, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 646 days.

(21) Appl. No.: 16/777,531

(22) Filed: Jan. 30, 2020

(65) Prior Publication Data
US 2021/0242317 A1 Aug. 5, 2021

(51) Int. Cl.
*H01L 29/417* (2006.01)
*H01L 29/78* (2006.01)

(52) U.S. Cl.
CPC .. *H01L 29/41775* (2013.01); *H01L 29/41791* (2013.01); *H01L 29/7851* (2013.01)

(58) Field of Classification Search
CPC ......... H01L 29/41775; H01L 29/66545; H01L 29/41791; H01L 29/66795; H01L 29/785–7851; H01L 29/41766; H01L 29/4175; H01L 29/665; H01L 29/7845; H01L 21/823475; H01L 21/823871; H01L 21/823425; H01L 21/823431; H01L 21/823821; H01L 27/0886; H01L 27/1211; H01L 27/0924
See application file for complete search history.

(56) References Cited

U.S. PATENT DOCUMENTS

| | | | |
|---|---|---|---|
| 6,914,288 B2 * | 7/2005 | Itou | H10B 41/35 438/257 |
| 7,332,766 B2 * | 2/2008 | Hasegawa | H10B 41/40 257/314 |
| 8,524,592 B1 | 9/2013 | Xie et al. | |
| 8,883,585 B1 * | 11/2014 | Fumitake | H01L 29/785 438/197 |
| 9,543,435 B1 * | 1/2017 | Basker | H01L 29/42392 |
| 9,564,363 B1 * | 2/2017 | Wang | H01L 21/76895 |
| 10,170,480 B2 * | 1/2019 | Liaw | H01L 21/28079 |
| 10,283,592 B2 * | 5/2019 | Bi | H01L 29/41791 |
| 2012/0280290 A1 * | 11/2012 | Khakifirooz | H01L 27/0207 257/288 |
| 2014/0306291 A1 | 10/2014 | Alptekin et al. | |
| 2016/0181383 A1 * | 6/2016 | Huang | H01L 21/302 257/757 |
| 2016/0268244 A1 * | 9/2016 | Young | H01L 21/823425 |
| 2017/0222014 A1 * | 8/2017 | Tak | H01L 21/76895 |

(Continued)

*Primary Examiner* — Errol V Fernandes
*Assistant Examiner* — Jeremy J Joy
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to self-aligned contacts and methods of manufacture. The structure includes: adjacent diffusion regions located within a substrate material; sidewall structures above an upper surface of the substrate material, aligned on sides of the adjacent diffusion regions; and a contact between the sidewall structures and extending to within the substrate material between and in electrical contact with the adjacent diffusion regions.

19 Claims, 4 Drawing Sheets

(56) References Cited

U.S. PATENT DOCUMENTS

| | | | |
|---|---|---|---|
| 2017/0317087 A1* | 11/2017 | Chen | H01L 27/0924 |
| 2018/0166571 A1* | 6/2018 | Liu | H01L 23/53266 |
| 2018/0261596 A1* | 9/2018 | Jun | H01L 29/0653 |
| 2019/0371898 A1* | 12/2019 | Huang | H01L 23/485 |
| 2020/0006552 A1* | 1/2020 | Anderson | H01L 29/7827 |
| 2020/0176444 A1* | 6/2020 | Xu | H01L 21/823431 |
| 2020/0185266 A1* | 6/2020 | Zang | H01L 29/66545 |

* cited by examiner

SELF-ALIGNED CONTACT

FIELD OF THE INVENTION

The present disclosure relates to semiconductor structures and, more particularly, to self-aligned contacts and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate back end of line (BEOL) and middle of line (MOL) metallization features, e.g., interconnects and contacts, due to the critical dimension (CD) scaling and process capabilities, as well as materials that are used to fabricate such structures.

For example, to manufacture contact structures for source and drain contacts, it is necessary to remove dielectric material which is adjacent to the gate structures. The removal of the dielectric material is provided by an etching process, which also tends to erode the spacer material of the gate structure. That is, the low-k dielectric material used for the spacer or sidewalls of the gate structure can be eroded away in the downstream etching processes used to form the openings for the drain and source contacts. This loss of material will expose the metal material of the gate structure, resulting in a short between the metal material of the gate structure and the metal material used to form the contact, itself.

Also, due to the shrinking of the device, contact open issues result to the narrow source and drain silicide contacts, particularly as a result of lithographic limits. Accordingly, to solve this issue, larger sized silicide contacts for the source and drain are fabricated; however, this results in a size penalty.

SUMMARY

In an aspect of the disclosure, a structure comprises: adjacent diffusion regions located within a substrate material; sidewall structures above an upper surface of the substrate material, aligned on sides of the adjacent diffusion regions; and a contact between the sidewall structures and extending to within the substrate material between and in electrical contact with the adjacent diffusion regions.

In an aspect of the disclosure, a structure comprises: a source/drain region in a substrate; a pair of outer spacers above the source/drain region; and a contact to the source/drain region located between the pair of outer spacers and extending to below a surface of the substrate.

In an aspect of the disclosure, a structure comprising: a substrate; a first gate structure over the substrate; a second gate structure over the substrate and spaced apart from the first gate structure; a first source/drain region adjacent to the first gate structure and between the first gate structure and the second gate structure; a second source/drain region adjacent to the second gate structure and between the first gate structure and the second gate structure; and a contact extending into the substrate and making contact with the first source/drain region and the second source/drain region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to self-aligned contacts and methods of manufacture. More specifically, the present disclosure describes a self-aligned silicide contact for contacted gate (poly) pitch (CPP) devices. Advantageously, the present disclosure provides self-aligned contact formation on a wide gate pitch, for example, a 2×CPP (i.e., a gate pitch wider than 1×CPP) device or a 3×CPP device, in small technology nodes.

The self-aligned contacts of the present disclosure can be manufactured in a number of ways using a number of different tools. In general, though, the methodologies and tools are used to form structures with dimensions in the micrometer and nanometer scale. The methodologies, i.e., technologies, employed to manufacture the self-aligned contacts of the present disclosure have been adopted from integrated circuit (IC) technology. For example, the structures are built on wafers and are realized in films of material patterned by photolithographic processes on the top of a wafer. In particular, the fabrication of the self-aligned contacts uses three basic building blocks: (i) deposition of thin films of material on a substrate, (ii) applying a patterned mask on top of the films by photolithographic imaging, and (iii) etching the films selectively to the mask.

Figure 1A:
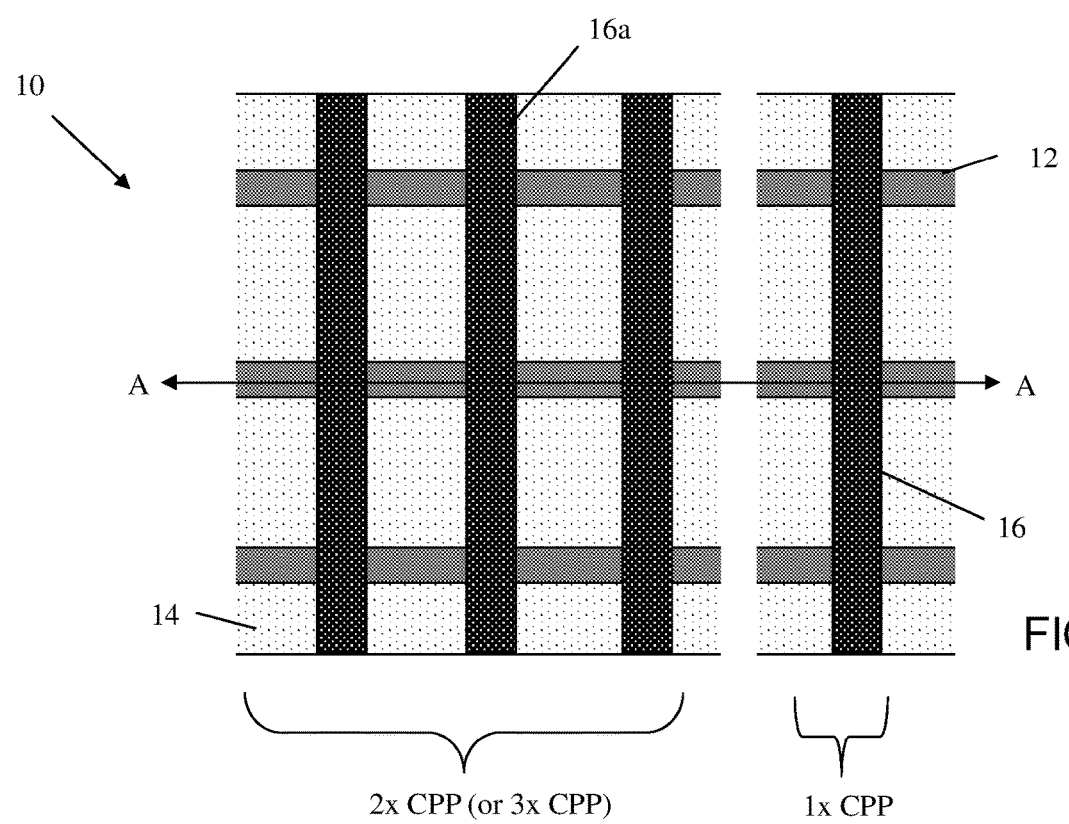
FIG. 1A shows a plan view of a plurality of fin structures and dummy gate structures, amongst other features, and respective fabrication processes in accordance with aspects of the present disclosure.
Figure 1B:
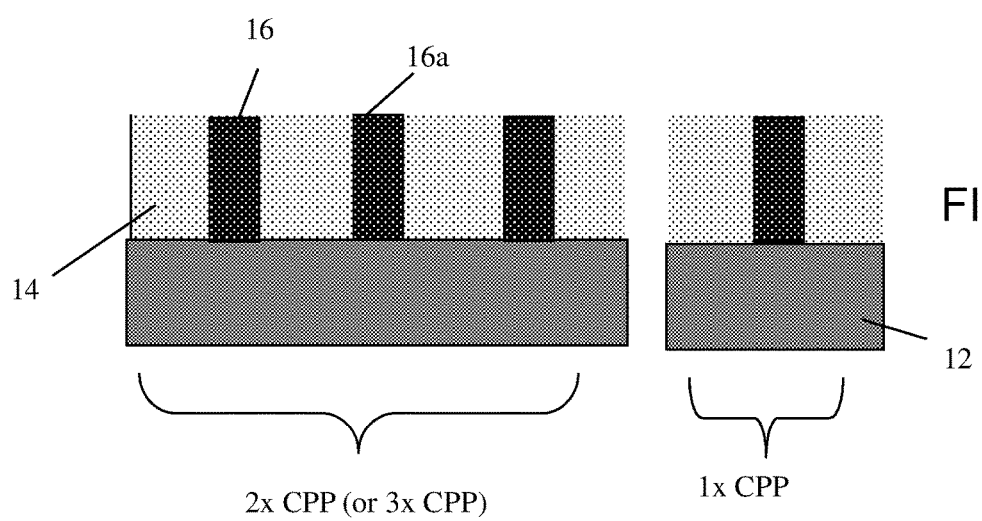
FIG. 1B shows a cross-sectional view of FIG. 1A along line A-A.

FIG. 1A shows a plan view of a plurality of fin structures and dummy gate structures, amongst other features, and related fabrication processes. FIG. 1B shows a cross-sectional view of FIG. 1A along line A-A. More specifically and referring to FIGS. 1A and 1B, the structure 10 includes a plurality of fin structures 12 formed from a substrate material, in both a 2×CPP and 1×CPP design scheme. It should be understood that the processes described herein for the 2×CPP design scheme can also be implemented in a 3×CPP design scheme, and that the use of a 2×CPP design scheme and 1×CPP design scheme are provided for ease of illustration.

In embodiments, the fin structures 12 are composed of substrate material which can be either bulk materials or semiconductor on insulator (SOI) technologies. For example, the plurality of fin structures 12 may be composed of any suitable material including, but not limited to, Si, SiGe, SiGeC, SiC, GaAs, InAs, InP, and other III/V or II/VI compound semiconductors. In the SOI technologies, an insulator layer is provided on top of a semiconductor wafer. The insulator layer comprises any suitable material including, e.g., silicon oxide, sapphire, or a buried oxide layer (BOX). A semiconductor material is formed on top of the insulator layer to form a semiconductor-on-insulator (SOI) substrate, which can be fabricated using wafer bonding, and/or other suitable methods. The semiconductor material can be composed of any of the materials described herein and is used in the fabrication of the plurality of fin structures 12.

The fin structures 12 can be fabricated using conventional lithography and etching techniques including sidewall image transfer (SIT) or self-aligned double patterning (SADP). In the SIT technique, for example, a mandrel is formed on the substrate material using conventional CVD processes. A resist is formed on the mandrel material, and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 12, for example. The mandrels are removed or stripped using a conventional etching process, selective to the mandrel material. An etching is then performed within the spacing of the spacers to form the sub-lithographic features. The sidewall spacers can then be stripped.

As further shown in FIGS. 1A and 1B, isolation material 14 is deposited between the fin structures 12. The isolation material 14 is deposited using conventional deposition methods, e.g., a chemical vapor deposition (CVD) process. In embodiments, the isolation material 14 can be an oxide material. Following the deposition process, the isolation material 14 can be subjected to a planarization process, e.g., chemical mechanical processes (CMP).

Dummy gate structures 16, 16a are formed, and isolation material 14 is filled in between them using conventional deposition, lithography, and etching processes. It should be understood by those of skill in the art that the dummy gate structures 16, 16a preferably have the same gate width and the same gate to gate distance.

To form the dummy gate structures, for example, an optional gate dielectric material and polysilicon material can be deposited by any conventional deposition processes, e.g., CVD processes. Then, for example, a resist formed over the dummy gate material is exposed to energy (light) to form a pattern (opening). An etching process with a selective chemistry, e.g., RIE, will be used to form dummy gate structures 16, 16a. Following the resist removal by a conventional oxygen ashing process or other known stripants, the insulator material 14 is deposited inside trenches between the dummy gate structures 16, 16a. Any residual material can be removed by conventional CMP processes. In embodiments, the gate dielectric material can be high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. In embodiments, the dummy gate structures 16, 16a are formed over the fin structures 12.

Figure 2:
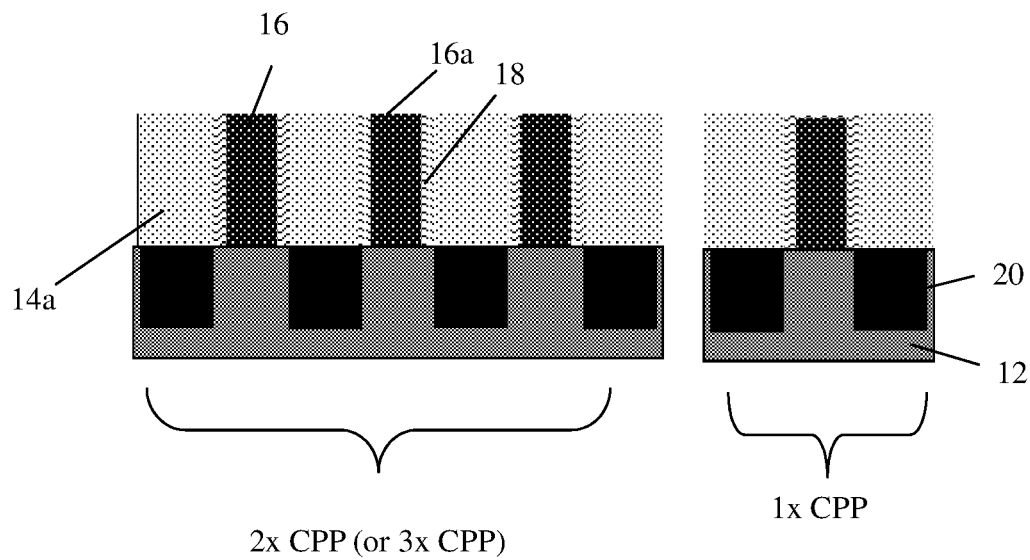
FIG. 2 shows diffusion regions, amongst other features, and respective fabrication processes in accordance with aspects of the present disclosure.

In FIG. 2, diffusion regions 20 (e.g., source/drain regions) are provided in the substrate between the dummy gate structures 16, 16a. More specifically, the diffusion regions 20 (e.g., source/drain regions) are provided in the substrate between sidewalls (spacers) 18 of the gate structures 16, 16a. In this way, the sidewalls 18 of the gate structures 16, 16a are above the surface of the substrate and aligned with the diffusion regions 20.

In embodiments, the diffusion regions 20 are formed in the substrate of the plurality of fin structures 12 using an ion implantation process or epitaxial growth process, for example. In preferred embodiments, the diffusion regions 20 are of the same size. As should be understood by those of skill in the art, ion implantation is a low-temperature process by which ions of a particular element are accelerated into the plurality of fin structures 12, between the dummy gate structures 16, 16a. In more specific embodiments, the ion implantation processes or epitaxial growth process comprises a semiconductor doping with boron, phosphorus, or arsenic (depending on the type of device), followed by an anneal process (for ion implantation).

Prior to the ion implantation process, the insulator material 14 would be removed, followed by formation of sidewalls 18 on the dummy gate structures 16, 16a. The sidewalls 18 can be formed on the dummy gate structures 16, 16a by deposition of a low-k dielectric sidewall material, e.g., nitride, and anisotropic etching process as is known in the art. The anisotropic etching processes will remove the sidewall material from horizontal surfaces of the structure, e.g., an upper surface of the dummy gate structures 16, 16a and the plurality of fins 12. In this way, the removal of the insulator material and the sidewall material (by anisotropic etching processes) will expose the plurality of fins 12 for the ion implantation process, as should be understood by those of ordinary skill in the art. Subsequent to the ion implantation process, insulator material 14a will be redeposited within the spaces between the plurality of fins 12, over the diffusion regions 20. The insulator material 14a can also undergo a planarization process, e.g., CMP.

Figure 3:
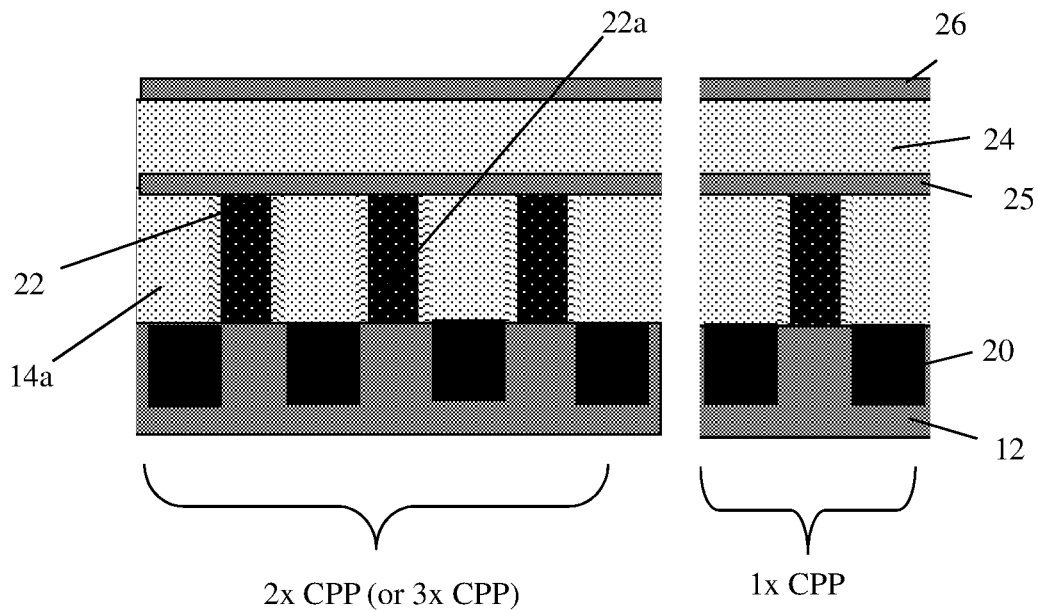
FIG. 3 shows replacement and sacrificial gate structures, amongst other features, and respective fabrication processes in accordance with aspects of the present disclosure.

In FIG. 3, the dummy gate structures are replaced with metal gate structures 22, 22a. In this example, the metal gate structure 22a is a sacrificial gate structure that will be removed at a later fabrication process to form a self-aligned source/drain contact. In embodiments, the material (e.g., poly) of the dummy gate structures 16, 16a is removed by conventional etching processes, and replaced with replacement metal gate material, e.g., workfunction materials, between the sidewalls 18. In embodiments, examples of the workfunction materials for a p-channel FET include Ti, TiAlC, Al, TiAl, TaN, TaAlC, TiN, TiC or Co and combination thereof. In one embodiment, TiN is used for a p-channel FET. Examples of the workfunction materials for an n-channel FET include TiN, TaN, TaAlC, TiC, TiAl, TaC, Co, Al, TiAl, HfTi, TiSi, TaSi or TiAlC and combination thereof. In one embodiment, TaAlC, TiAl or Al is used for an n-channel FET. The workfunction materials may be formed by chemical vapor deposition (CVD), physical vapor deposition (PVD) including sputtering, atomic layer deposition (ALD) or other suitable method. Following workfunction metal deposition, a conductive metal (e.g., W) will be used to fill in the rest of metal gate to increase gate conductibility. A CMP process follows the deposition of the workfunction materials.

Following the replacement gate processes, a capping material 25 is deposited over the replacement metal gate structures 22, sacrificial gate structure 22a and insulator material 14a. In embodiments, the capping material 25 can be a nitride material, e.g., SiN, deposited by conventional CVD processes. An insulator material 24 is deposited over the capping material 25, with a hardmask 26 deposited over the insulator material 24. In embodiments, the insulator material 24 can be a blanket deposition of oxide material; whereas, the hardmask 26 can be representative of a stack of lithographic materials.

Figure 4:
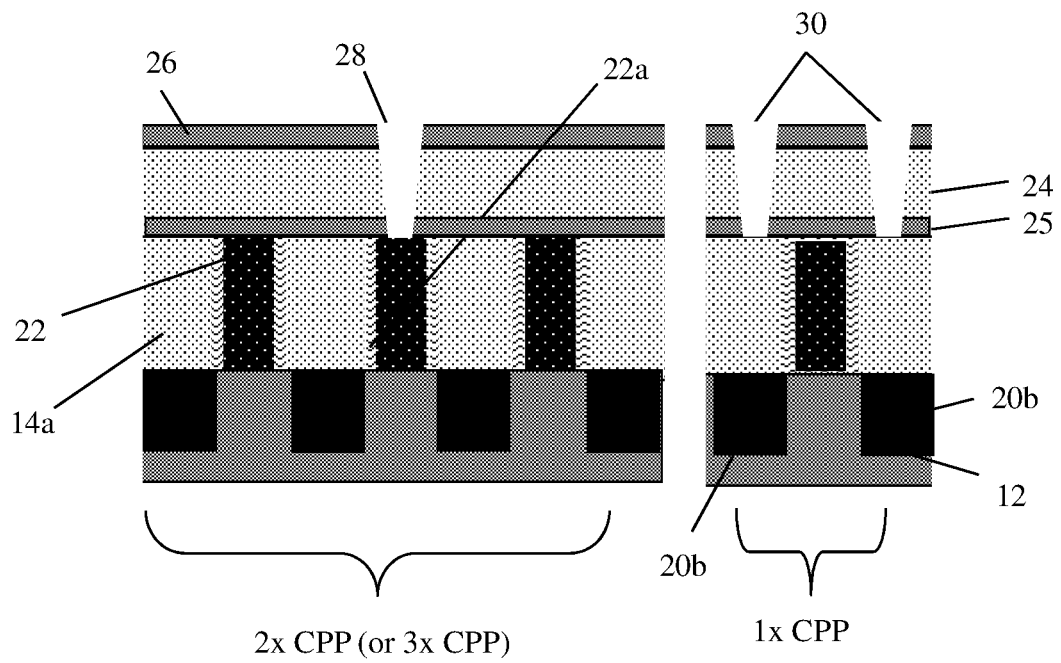
FIG. 4 shows a trench exposing the sacrificial gate structure, amongst other features, and respective fabrication processes in accordance with aspects of the present disclosure.

As shown in FIG. 4, trenches 28, 30 are formed through the hardmask 26, insulator material 24 and capping material 25. In embodiments, the trench 28 is tapered (e.g., wider at the top than at the bottom) and will expose the sacrificial gate structure 22a; whereas, the trenches 30 are also tapered and will extend to the capping material 25 and be aligned with the diffusion regions 20b. The trenches 28, 30 can be formed by conventional lithography and etching processes, with the hardmask 26 being part of the resist stack as an example.

Figure 5:
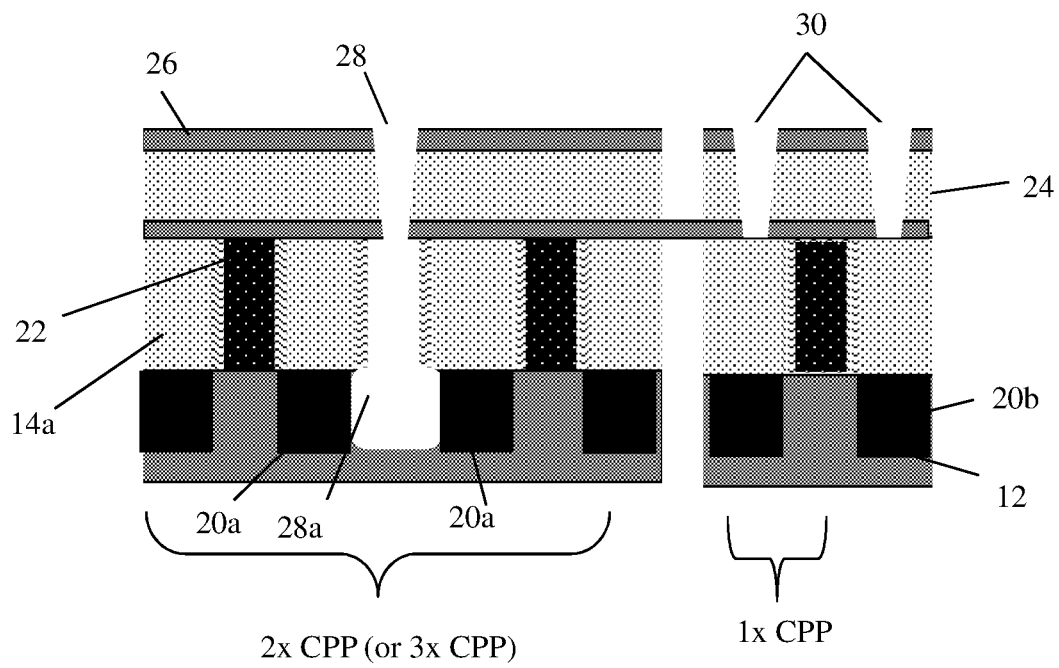
FIG. 5 shows a cavity in a fin structure between the diffusions, amongst other features, and respective fabrication processes in accordance with aspects of the present disclosure.

In FIG. 5, the sacrificial gate structure 22a is removed by an isotropic etching process performed through the trench 28. In embodiments, the gate dielectric material, if any, could also be removed using a selective directional etching process. The selective directional etching process can be a dry or wet etching process, known to those of ordinary skill in the art. During the etching (removal) process, the hardmask 26 and sidewalls 18 will protect the insulator material 24, 14a (e.g., interlevel dielectric material composed of, e.g., oxide).

The removal of the sacrificial gate structure 22a and, optionally, the gate dielectric material, will expose substrate material of the underlying fin structure 12 located between adjacent diffusion regions 20a. Also, the sidewalls 18 will be aligned with the sides of the adjacent diffusion regions 20a, protecting the oxide material, e.g., insulator material 14a, from processing damage. The exposed substrate material of the fin structure 12 will then undergo a recess process, e.g., Si recess, to form a cavity 28a extending under the sidewalls 18 and contacting adjacent diffusion regions 20a. In embodiments, the cavity 28a can be ball shaped, although other shapes are also contemplated herein.

The recess process is an isotropic Si etching process, which is highly selective to the sidewall material 18, e.g., low-k spacer material, and insulator material, e.g., oxide. In more specific embodiments, the recess process is a wet etching process or dry etching process. For example, dry etchants can include plasma-based $CF_4$, plasma-based $SF_6$, or gas $XeF_4$ silicon etch, etc., and wet etching processes can include KOH and $NH_4OH$. In embodiments, the cavity structure 28a is self-aligned with the adjacent diffusion regions 20a.

Figure 6:
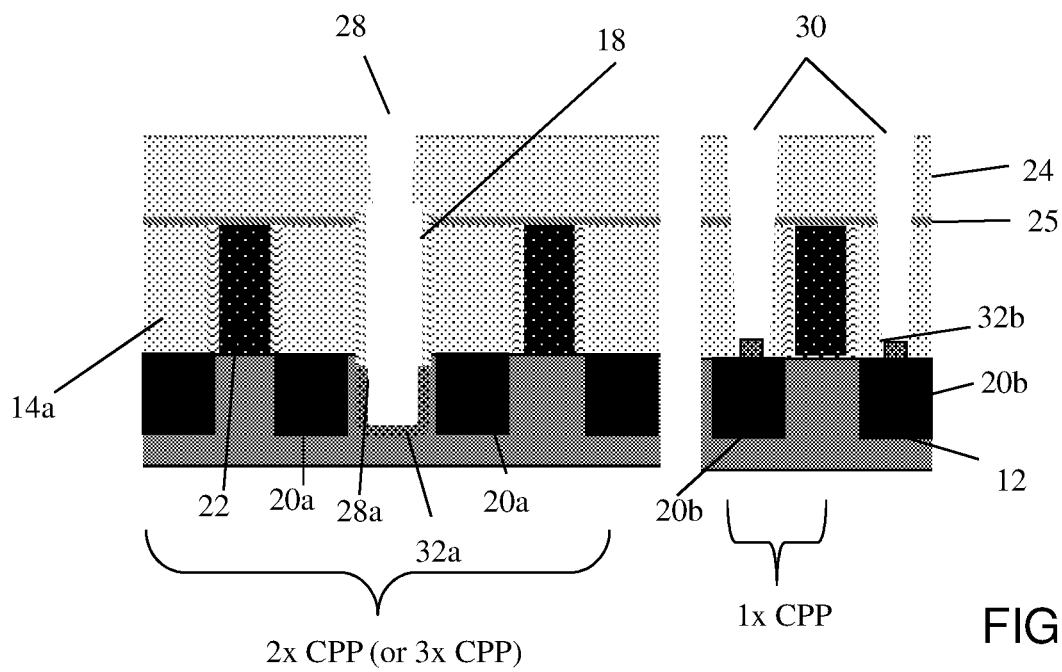
FIG. 6 shows silicide contacts, amongst other features, and respective fabrication processes in accordance with aspects of the present disclosure.

FIG. 6 shows an additional etching process in which the trenches 30 are extended to expose the underlying diffusions 20b. In embodiments, the etching process is an isotropic oxide etching process, which is highly selective to the Si or other substrate material of the fin structure 12; that is, the etching process will not attack the substrate material of the fin structure 12. The hardmask material is then removed using a conventional stripant process.

Still referring to FIG. 6, a silicide process is performed to form silicide contacts 32a, 32b on the diffusion regions 20a, 20b. As shown, the silicide contacts 32a are in contact with the diffusion regions 20a below the upper surface of the substrate material of the plurality of the fin structures 12; whereas, the silicide contacts 32b are in contact with the diffusion regions 20b above the surface of the substrate material of the plurality of the fin structures 12. In this way, in the 2×CCP or 3×CPP design scheme, the silicide contacts 32a and subsequently formed diffusion contacts will land on and make direct and proper contact (without shorting to an adjacent gate structure) with the diffusion regions 20a, regardless of the scaling of the device.

As should be understood by those of skill in the art, the silicide process begins with deposition of a thin transition metal layer, e.g., nickel, cobalt, titanium, TiSi, or TiN over fully formed and patterned semiconductor devices (e.g., doped or ion implanted source and drain regions 20a, 20b). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 32 in the active regions of the device.

Another option to form silicide contacts 32a and 32b is to selectively deposit TiSi on Si only by CVD, ALD or other methods. In this implementation, as is understood by one of skill in the art, the post anneal process could be skipped since TiSi has been formed as deposited.

Figure 7:
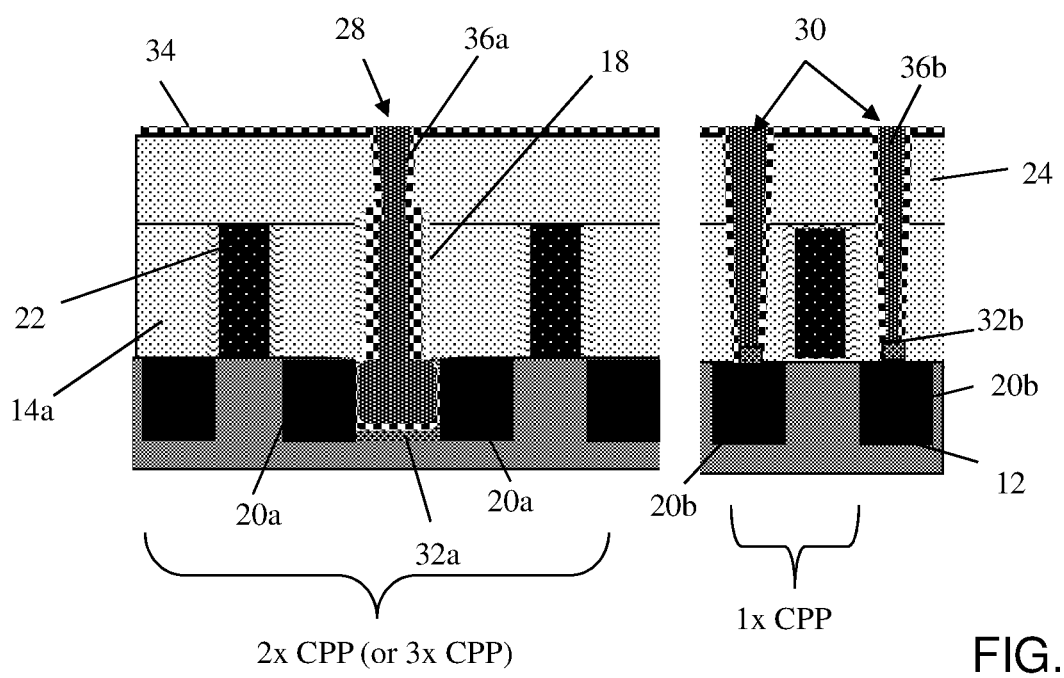
FIG. 7 shows self-aligned contacts, amongst other features, and respective fabrication processes in accordance with aspects of the present disclosure.

In FIG. 7, an optional liner material 34 is deposited within the trenches 28, 30 and within the cavity 28a. The optional liner can be a diffusion barrier layer such as TiN, deposited by conventional deposition methods, e.g., CVD, atomic layer deposition (ALD) plasma enhanced CVD (PECVD), etc. A metal fill material is then deposited in the 28, 30 and within the cavity 28a to form self-aligned contacts 36a, 36b. In embodiments, the metal fill material can be tungsten (W) which provides an electrical conduction path from the diffusions 20a. Any excessive metal fill material can be removed from the surface of the structure by a conventional CMP process.

The metal material in the cavity 28a will form a ball shaped contact 36a between the diffusion regions 20a. In this way, the contact 36a will have a wider dimension at its lower portion below the upper surface of the substrate material, compared to between the mid-portion between the outer sidewalls (spacers) 18 above the upper surface of the substrate material. It should be recognized that the mid-portion between the pair of sidewalls 18 (outer spacers) is at a level of the replacement second gate structures 22. The upper portion of the contact 36a can be tapered and is above the pair of sidewalls 18.

The self-aligned contacts can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
adjacent diffusion regions located within a substrate material;
gate structures above the substrate material and located between the adjacent diffusion regions;
sidewall structures above an upper surface of the substrate material and on sidewalls of a trench within interlevel dielectric material, the sidewall structures being aligned on sides of the adjacent diffusion regions and remote from the gate structures; and
a contact between the sidewall structures and extending to within the substrate material between and in electrical contact with the adjacent diffusion regions.

2. The structure of claim 1, further comprising silicide contacts below the upper surface of the substrate material and in direct contact with the adjacent diffusion regions.

3. The structure of claim 2, wherein the silicide contacts are an intervening material between the contact and the adjacent diffusion regions.

4. The structure of claim 2, wherein the contact provides an electrical conduction path to both the adjacent diffusion regions.

5. The structure of claim 4, wherein the contact is a self-aligned contact.

6. The structure of claim 4, wherein a portion of the contact below the upper surface of the substrate material is ball shaped.

7. The structure of claim 4, wherein the portion of the contact below the upper surface of the substrate material is wider than a portion of the contact between the sidewall structures.

8. The structure of claim 1, further comprising a contact that extends to additional diffusion regions above the upper surface of the substrate material, and the sidewall structures are adjacent to an outer edge of each of the adjacent diffusion regions.

9. The structure of claim 1, wherein the diffusion regions are source and/or drain regions for adjacent gate structures.

10. The structure of claim 9, wherein the substrate material is a fin of a finFET device.

11. The structure of claim 10, wherein the adjacent gate structures include sidewalls which are of a same material as the sidewall structures.

12. A structure comprising:
a source/drain region in a substrate;
interlevel dielectric material above the substrate;
a trench within the interlevel dielectric material and extending into the substrate adjacent to the source/drain region;
a pair of outer spacers above and adjacent to the source/drain region and on sidewalls of the trench of the interlevel dielectric material, and which are remotely positioned from a gate structure; and
a contact to the source/drain region located between the pair of outer spacers and extending to below a surface of the substrate,
wherein the source/drain region is adjacent source/drain regions comprising a first source/drain region and a second source/drain region for a first gate structure and a second gate structure, respectively, the contact abuts both the first source/drain region and the second source/drain region below the surface of the substrate, and the pair of outer spacers above the source/drain region are remote from both the first gate structure and the second gate structure and are adjacent to an outer edge of each of the adjacent source/drain regions.

13. The structure of claim 12, wherein the contact has a lower portion which is below the first and second gate structures.

14. The structure of claim 12, wherein the contact has a mid-portion which is between the pair of outer spacers and is at a level of the first and second gate structures.

15. The structure of claim 12, wherein the contact has an upper portion which is above the pair of outer spacers.

16. A structure comprising:
a substrate;
a first gate structure over the substrate;
a second gate structure over the substrate and spaced apart from the first gate structure;
a first source/drain region adjacent to the first gate structure and between the first gate structure and the second gate structure;
a second source/drain region adjacent to the second gate structure and between the first gate structure and the second gate structure; and
interlevel dielectric material between the first gate structure and the second gate structure;
a trench within the interlevel dielectric material, spaced away from the first gate structure and the second gate structure;
sidewall structures on sidewalls of the trench, spaced away from the first gate structure and the second gate structure;
a contact contacting the sidewall structures, extending into the substrate, and making contact with the first source/drain region and the second source/drain region.

17. The structure of claim 16, wherein the contact partially extends between opposing sidewalls of the sidewall structures which are above the substrate.

18. The structure of claim 17, wherein a lower portion of the contact is wider than a portion of the contact that partially extends between the opposing sidewalls above the substrate.

19. The structure of claim 16, further comprising silicide contacts below an upper surface of the substrate and in direct contact with the first source/drain region and the second source/drain region, and a liner material between the sidewall structures and the contact, and on an upper surface of the interlevel dielectric material.

* * * * *